(12) United States Patent
Nagahama et al.

(10) Patent No.: US 8,872,203 B2
(45) Date of Patent: Oct. 28, 2014

(54) LIGHT-EMITTING DEVICE

(75) Inventors: Shinichi Nagahama, Tokushima (JP);
Atsutomo Hama, Anan (JP); Takafumi Sugiyama, Komatsushima (JP);
Yukihiro Hayashi, Tokushima (JP);
Naoto Morizumi, Yoshinogawa (JP);
Yoshinori Murazaki, Komatsushima (JP)

(73) Assignee: Nichia Corporation, Anan-Shi (JP)

( * ) Notice: Subject to any disclaimer, the term of this patent is extended or adjusted under 35 U.S.C. 154(b) by 779 days.

(21) Appl. No.: 12/232,101

(22) Filed: Sep. 10, 2008

(65) Prior Publication Data
US 2009/0003400 A1  Jan. 1, 2009

Related U.S. Application Data

(63) Continuation of application No. PCT/JP2007/054709, filed on Mar. 9, 2007.

(30) Foreign Application Priority Data

Mar. 10, 2006  (JP) ................................ 2006-066400

(51) Int. Cl.
*H01L 33/00*     (2010.01)
*H01S 5/022*     (2006.01)
*H01L 33/48*     (2010.01)
*H01S 5/00*      (2006.01)
*H01S 5/40*      (2006.01)

(52) U.S. Cl.
CPC ............... *H01L 33/483* (2013.01); *H01S 5/005* (2013.01); *H01S 5/02296* (2013.01); *H01S 5/02288* (2013.01); *H01S 5/4025* (2013.01); *H01S 5/02212* (2013.01)
USPC ..................................... 257/98; 257/E33.067

(58) Field of Classification Search
USPC .......................................................... 257/98
See application file for complete search history.

(56) References Cited

U.S. PATENT DOCUMENTS 5,535,230 A     7/1996  Abe
5,813,753 A *   9/1998  Vriens et al. .................. 362/293

(Continued)

FOREIGN PATENT DOCUMENTS

EP     1 681 728      7/2006
JP     6-334269       12/1994

(Continued)

OTHER PUBLICATIONS

International Search Report for PCT/JP2007/054709, mailed May 22, 2007.

(Continued)

*Primary Examiner* — Benjamin Sandvik
(74) *Attorney, Agent, or Firm* — Nixon & Vanderhye PC

(57) ABSTRACT

In a semiconductor light-emitting device, light from a laser diode is output to the outside after the luminance of the light being enhanced. It includes a support body provided with lead terminals, one or more laser diodes mounted on the support body, a cylindrical reflector fixed to the support body to surround the laser diode(s) and provided with a light reflection surface formed on an inner surface thereof, and a cap placed to cover an opening distal end face of the reflector and held at an opening distal end part of the reflector, the cap being provided at a central part thereof with a solid fluorescent member including a fluorescent substance that is excited by the light from the laser diode and emits light different in colors from light emitted by the laser diode.

14 Claims, 7 Drawing Sheets

(56) References Cited

U.S. PATENT DOCUMENTS

| | | | |
|---|---|---|---|
| 6,188,495 B1* | 2/2001 | Inoue et al. | 398/139 |
| 6,353,491 B1* | 3/2002 | Tanaka et al. | 398/139 |
| 6,469,322 B1 | 10/2002 | Srivastava et al. | |
| 6,809,342 B2* | 10/2004 | Harada | 257/79 |
| 6,986,593 B2* | 1/2006 | Rhoads et al. | 362/308 |
| 7,782,550 B2* | 8/2010 | Vancoille | 359/726 |
| 8,106,414 B2* | 1/2012 | Sugiyama | 257/98 |
| 2004/0066815 A1* | 4/2004 | Okazaki | 372/43 |
| 2004/0095063 A1* | 5/2004 | Murazaki et al. | 313/503 |
| 2004/0120155 A1* | 6/2004 | Suenaga | 362/362 |
| 2004/0145913 A1* | 7/2004 | Ouderkirk et al. | 362/555 |
| 2004/0190304 A1* | 9/2004 | Sugimoto et al. | 362/555 |
| 2004/0263074 A1* | 12/2004 | Baroky et al. | 313/512 |
| 2005/0006658 A1* | 1/2005 | Ho | 257/99 |
| 2005/0212397 A1* | 9/2005 | Murazaki et al. | 313/487 |
| 2006/0012299 A1* | 1/2006 | Suehiro et al. | 313/512 |
| 2006/0093011 A1* | 5/2006 | Vancoille | 372/101 |
| 2006/0139926 A1 | 6/2006 | Morioka et al. | |
| 2006/0291246 A1* | 12/2006 | Hattori et al. | 362/614 |
| 2008/0116473 A1 | 5/2008 | Sugiyama | |

FOREIGN PATENT DOCUMENTS

| | | |
|---|---|---|
| JP | 7-282609 | 10/1995 |
| JP | 10-190133 | 7/1998 |
| JP | 11-87778 | 3/1999 |
| JP | 11-87784 | 3/1999 |
| JP | 2002-340698 | 11/2002 |
| JP | 2003-204108 | 7/2003 |
| JP | 2003-258308 | 9/2003 |
| JP | 2003-295319 | 10/2003 |
| JP | 2004/349647 | 12/2004 |
| JP | 2005-3847 | 1/2005 |
| JP | 2005-20010 | 1/2005 |
| JP | 2005-166733 | 6/2005 |
| JP | 2005-268323 A | 9/2005 |
| JP | 2005-294185 | 10/2005 |
| JP | 2005-294288 | 10/2005 |
| JP | 2005-354016 | 12/2005 |
| JP | 2006-032726 A | 2/2006 |
| JP | 2006-210887 | 8/2006 |
| JP | 2007-5483 | 1/2007 |
| JP | 4054594 | 12/2007 |
| JP | 2008-153617 | 7/2008 |
| WO | WO 2005/038935 | 4/2005 |
| WO | 2005/088787 | 9/2005 |
| WO | WO 2005/097938 | 10/2005 |

OTHER PUBLICATIONS

European Search Report issued in EP Application 07738194.5 (Oct. 6, 2010).

Translation of the International Preliminary Report on Patentability for PCT/JP2007/054709, issued Sep. 16, 2008. (All documents cited therein were previously reported on an IDS dated Sep. 10, 2008.).

Japanese Office Action dated Apr. 3, 2012, issued in corresponding Japanese Application No. 2008-505119 with English translation.

* cited by examiner

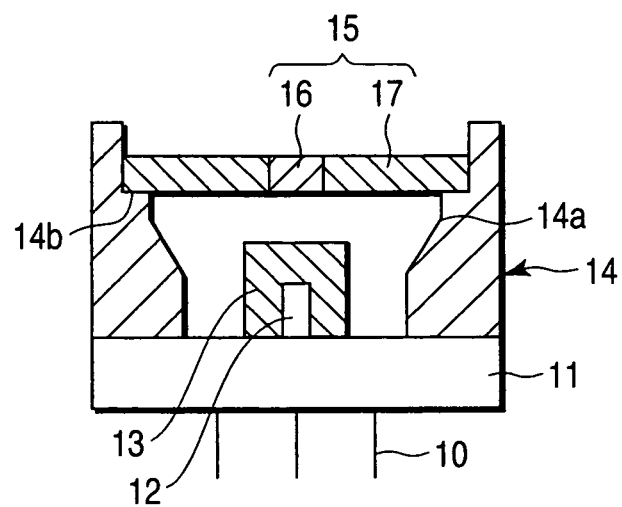
F I G. 1A
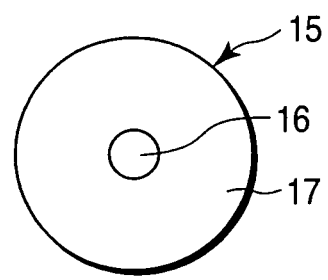
F I G. 1B

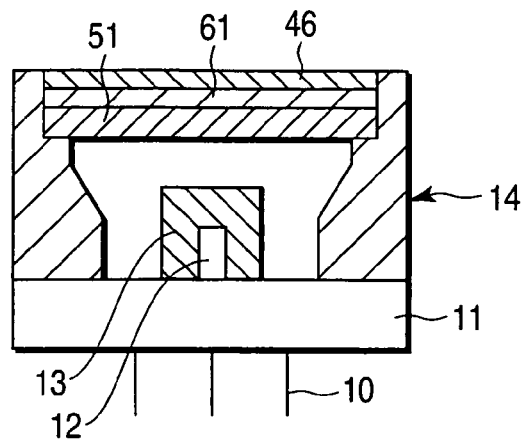
F I G. 6
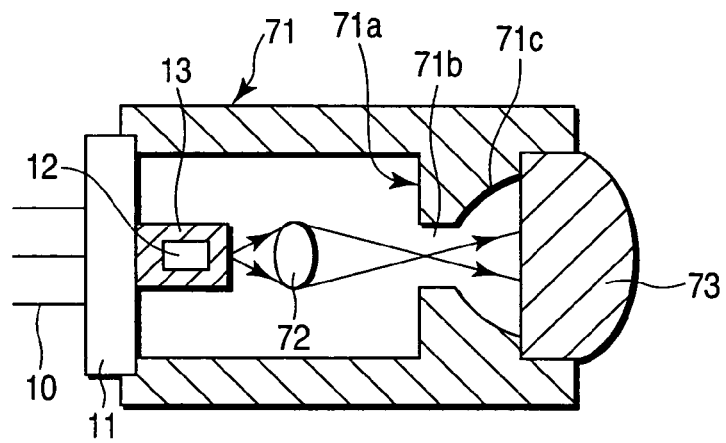
F I G. 7
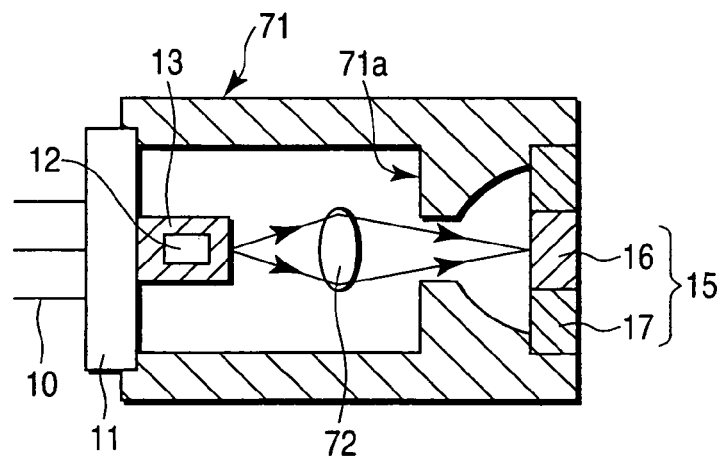
F I G. 8

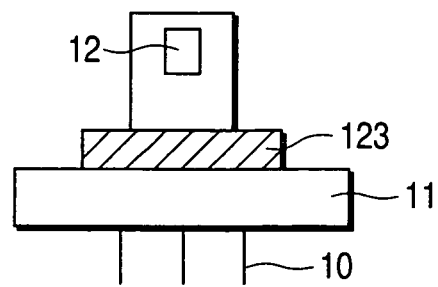
F I G. 12
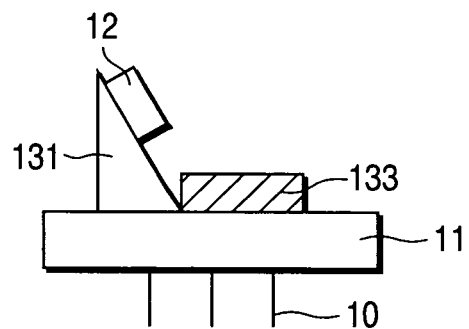
F I G. 13
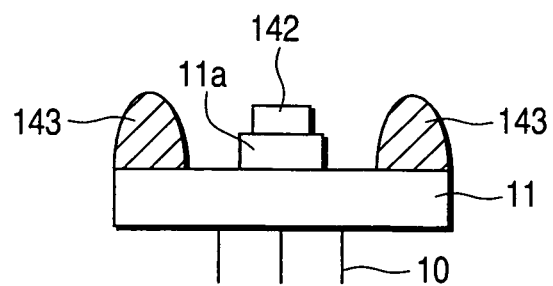
F I G. 14

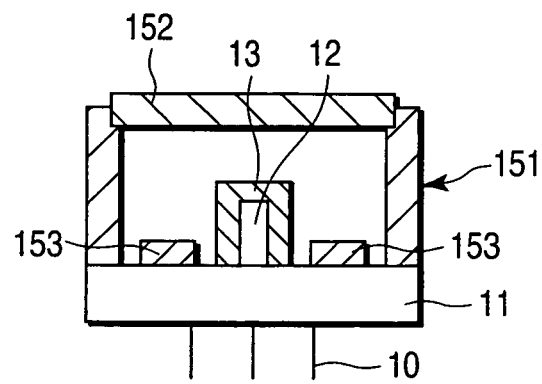
F I G. 15
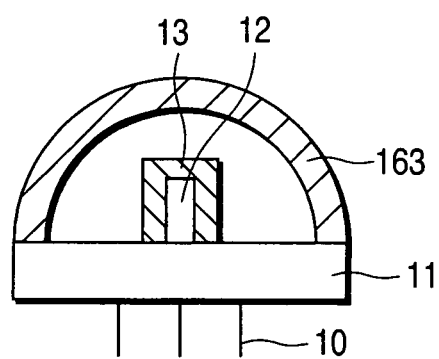
F I G. 16

LIGHT-EMITTING DEVICE

CROSS-REFERENCE TO RELATED APPLICATIONS

This is a Continuation Application of PCT Application No. PCT/JP2007/054709, filed Mar. 9, 2007, which was published under PCT Article 21(2) in Japanese.

This application is based upon and claims the benefit of priority from prior Japanese Patent Application No. 2006-066400, filed Mar. 10, 2006, the entire contents of which are incorporated herein by reference.

BACKGROUND OF THE INVENTION

1. Field of the Invention

The present invention relates to a light-emitting device, and more particularly, to a structural arrangement of a wavelength conversion member in a light-emitting device in which a chip of a laser diode is used as a light-emitting element.

2. Description of the Related Art

A light-emitting device in which a chip of a laser diode (LD) or a light-emitting diode (LED) is used as a light-emitting element is small in size, is of low power consumption, and has a long service life. Hence, such a light-emitting device is used in a wide range of the fields, e.g., backlight of a liquid crystal display, onboard use, and the like. Light emitted by such light-emitting elements is monochromatic light of limited colors such as red, green, and blue. Such light-emitting elements are sometimes used in combination with a fluorescent substance for converting the monochromatic light into light of a different wavelength. For example, a light-emitting device is known in which light from a light-emitting element directly output to the outside, light emitted by the light-emitting element, and wavelength-converted light emitted by a fluorescent substance are color-mixed with one another, thereby emitting white-colored light.

Incidentally, in Jpn. Pat. Appln. KOKAI Publication No. 11-87784, disclosed is an LED device having a shell-like shape whose surface is equipped or covered with a translucent covering member or a translucent covering layer containing a fluorescent substance for wavelength conversion; a material of the translucent covering member or the covering layer; and a fluorescent substance contained in the material, and the like.

Further, in Jpn. Pat. Appln. KOKAI Publication No. 2003-258308, it is disclosed that light emitted by an LED is converted into light of another color by a color conversion member made of glass into which an inorganic fluorescent substance is added and dispersed, and that in a use in which glass is required to have a high mechanical strength, it is desirable that a thickness of the glass be 0.2 mm or larger, from the viewpoint of mechanical strength.

Further, in Jpn. Pat. Appln. KOKAI Publication No. 2005-20010, a white light-emitting device is disclosed in which a fluorescent composition is placed such that the composition receives light from an LD, and the fluorescent composition emits light having a wavelength longer than the light from the LD.

On the other hand, in Jpn. Pat. Appln. KOKAI Publication No. 2003-295319, a light source device is disclosed in which laser light is absorbed by a fluorescent substance and which emits incoherent light.

BRIEF SUMMARY OF THE INVENTION

The present invention has been contrived by eagerly repeating studies on a method of utilizing a fluorescent substance that receives light from a light-emitting element, and an object thereof is to provide a light-emitting device capable of enhancing luminance of light from a light-emitting element, and outputting the light to the outside.

A first aspect of the present invention is a light-emitting device comprising a support body, a light-emitting element constituted by a laser diode mounted on the support body, a cylindrical reflector fixed to the support body and provided with a light reflection surface on its inner surface surrounding the light-emitting element, and a cap provided at a part thereof with a wavelength conversion member for emitting light having a wavelength different from that of the light emitted by the light-emitting element, the cap being placed on the reflector to cover an opening part of the reflector.

Here, the wavelength conversion member may further include a diffusion material for diffusing the emitted light from the light-emitting element. Further, the cap may be the one in which the wavelength conversion member is held by a translucent member at an outer circumferential surface thereof. An example of the cap is the one in which a translucent member holds a circumferential surface of a circular or rectangular fluorescent member placed at a central part, or circumferential surfaces of fluorescent members contiguously arranged at a central part such that the members are integrally combined, which can be manufactured easily.

Further, the planar shape of the wavelength conversion member may be modified in accordance with a cross-sectional beam pattern shape of emitted output light from the light-emitting element on an irradiated surface. However, the planar shape of the wavelength conversion member is a shape in which the cross-sectional beam pattern shape of emitted output light from the light-emitting element on the irradiated surface is mostly included. In this case, by positioning the wavelength conversion member at the central part of the cap and by making the planar shape of the wavelength conversion member substantially coincident with the cross-sectional beam pattern shape of the emitted output light from the light-emitting element on the irradiated surface, the emitted output light is evenly wavelength-converted, thereby obtaining a remarkable advantage that color irregularity of the emitted output light is reduced. In actual practice, the planar shape of the wavelength conversion member may not completely coincide with the pattern shape of the beam cross section, and the planar shape may be set slightly larger or smaller than the pattern shape of the beam cross section. Incidentally, when the cross-sectional beam pattern shape of the emitted output light from the light-emitting element on the irradiated surface is an ellipse, the planar shape of the wavelength conversion member is made, for example, circular such that the planar shape includes a major axis of the ellipse.

Further, the wavelength conversion member may have an in-plane deviation in the wavelength conversion capability. For example, the amount of the fluorescent substance may be distributed in such a state that the amount of the fluorescent substance is denser at the central part of the pattern shape of the beam cross section than at the peripheral part thereof.

Further, the light-emitting device may further include a convergent lens which is placed inside the reflector to make light from the light-emitting element converge and the converging light incident on the fluorescent member. Further, the cap may be constituted by the fluorescent member in its entirety. Further, the light-emitting device may further include a sealing member for sealing the light-emitting element inside the reflector. Further, a thermal conductive member may be provided such that it covers the wavelength conversion member at an opening part of the reflector. Further, a dielectric film for reflecting light having a wavelength longer than a wavelength of the light from the light-emitting element may be provided such that it covers the opening part of the reflector.

Further, a first dielectric film for reflecting light having a wavelength longer than a wavelength of the light from the light-emitting element, a thermal conductive member, a wavelength conversion member, and a second dielectric film for reflecting the light from the light-emitting element may be arranged to be stacked one on top of the other in the order mentioned. As a result of this, it is possible for the wavelength conversion member including the fluorescent substance, which is excited by the light from the light-emitting element and emits light having a wavelength longer than the wavelength of the light from the light-emitting element, to efficiently wavelength-convert the light from the light-emitting element, and the wavelength-converted light can be efficiently extracted from the light-emitting device. Incidentally, when heat radiation from the reflector is sufficient, the above-mentioned thermal conductive member may be omitted. Further, it is sufficient if the thermal conductive member is thermally connected to the wavelength conversion member so that heat radiation from the wavelength conversion member can be promoted, and the order of the arrangement of the wavelength conversion member and the dielectric films is arbitrary.

A second aspect of the present invention is a light-emitting device comprising a support body, a light-emitting element constituted by a laser diode mounted on the support body, a cylindrical receptacle fixed to the support body in such a manner that an inner surface thereof surrounds the light-emitting element, a cup section including a light reflection surface inclined from a light-transmitting aperture, which is produced by partially protruding an inner surface of the receptacle, toward a distal end of an opening part of the receptacle, a cap including a wavelength conversion member in at least a part thereof and provided such that it covers an opening part of the cup section, and a convergent lens placed in the receptacle at a position closer to the light-emitting element side than the cup section and allowing light from the light-emitting element to converge and the converging light to pass through the aperture, thereby making the light incident on the wavelength conversion member.

Here, the cap may be constituted by a convex lens-like wavelength conversion member. Further, the cap may be the one in which the wavelength conversion member placed at a central part of the cap is held by a translucent member at an outer circumferential surface of the wavelength conversion member.

A third aspect of the present invention is a light-emitting device comprising a support body, a light-emitting element constituted by a laser diode mounted on the support body, a cylindrical receptacle fixed to the support body in such a manner that an inner surface thereof surrounds the light-emitting element, a cup fixed to a distal end part of the receptacle at a proximal end part thereof, and including a light reflection surface inclined from a light-transmitting aperture, which is produced by protruding a part of an inner surface thereof, toward a distal end of an opening part thereof, a cap including a wavelength conversion member in at least a part thereof and placed such that it covers an opening part of the cup, and a convergent lens placed in the receptacle at a position closer to the light-emitting element side than the cup section and allowing light from the light-emitting element to converge and the converging light to pass through the aperture, thereby irradiating the wavelength conversion member.

Here, the cap may be the one in which the wavelength conversion member placed at a central part of the cap is held by a translucent member at an outer circumferential surface of the wavelength conversion member.

A fourth aspect of the present invention is a light-emitting device comprising a support body, a light-emitting element constituted by a laser diode mounted on the support body, a cylindrical receptacle fixed to the support body in such a manner that an inner surface thereof surrounds the light-emitting element, a light guide member a proximal end face of which faces and is in contact with an end face of the receptacle surrounding an opening thereof, a wavelength conversion member fixed to a distal end face of the light guide member, and a convergent lens placed in the receptacle at a position closer to the light-emitting element side than the light guide member and making light from the light-emitting element converge and the converging light incident on one end side of the light guide member.

A fifth aspect of the present invention is a light-emitting device comprising a support body, a light-emitting element constituted by a laser diode mounted on the support body, and a wavelength conversion member mounted on a part of the support body where it receives a peak intensity of the irradiation and emitting light different in wavelengths from light emitted by the light-emitting element when the light-emitting element emits the light.

BRIEF DESCRIPTION OF THE SEVERAL VIEWS OF THE DRAWING

FIG. 1A is a partial cross-sectional side view schematically showing an example of a light-emitting device according to Example 1 of the present invention.

FIG. 1B is a plan view schematically showing an example of a cap used in the light-emitting device of FIG. 1A.

FIG. 6 is a partial cross-sectional side view schematically showing an example of a light-emitting device of Example 6.

FIG. 7 is a partial cross-sectional side view schematically showing an example of a light-emitting device of Example 7.

FIG. 8 is a partial cross-sectional side view schematically showing an example of a light-emitting device of Example 8.

FIG. 12 is a partial cross-sectional side view schematically showing an example of a light-emitting device of Example 12.

FIG. 13 is a partial cross-sectional side view schematically showing an example of a light-emitting device of Example 13.

FIG. 14 is a partial cross-sectional side view schematically showing an example of a light-emitting device of Example 14.

FIG. 15 is a partial cross-sectional side view schematically showing an example of a light-emitting device of Example 15.

FIG. 16 is a partial cross-sectional side view schematically showing an example of a light-emitting device of Example 16.

DETAILED DESCRIPTION OF THE INVENTION

Figure 2A:
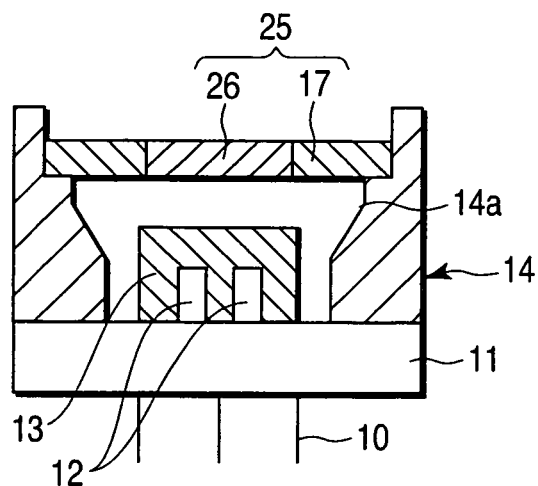
FIG. 2A is a partial cross-sectional side view schematically showing an example of a light-emitting device of Example 2.

Embodiments and examples of a light-emitting device according to the present invention will be described below. However, the present invention is not limited to these embodiments and examples. In the following description, the same or similar parts are denoted by the same reference symbols throughout all the drawings. Further, in the following embodiments and examples, an element having high directivity of output emitted light, such as an LD chip or an edge-emitting LED chip, can be used as the light-emitting element.

First Embodiment

FIG. 1A is a partial cross-sectional side view schematically showing an example of a light-emitting device according to a first embodiment. This light-emitting device includes, as main constituent elements, a support body (radiation plate) 11 provided with lead terminals 10, a light-emitting element (an LD chip in this example) 12 mounted on the support body, a translucent covering member 13 covering (sealing) the light-emitting element, a cylindrical reflector 14 which is constituted by, for example, a metallic body, placed to surround the light-emitting element and fixed to the support body, and a cap 15 which is placed to cover an opening part of the reflector and is held at an opening distal end part of the reflector. Incidentally, the light-emitting element 12 is mounted on the support body at, for example, a central part thereof, in such a state that the element 12 emits an output emission light in a direction of the opening distal end of the reflector. On an inner surface of the reflector 14, a light reflection surface 14a inclined toward the distal end of the reflector at a peripheral part of the light-emitting element is formed. The above-mentioned cap 15 includes, for example, a solid fluorescent member 16 containing a fluorescent substance in at least a part thereof as a wavelength conversion member which is excited by light from the light-emitting element 12, and emits light having a wavelength different in emitting color from the light emitted by the light-emitting device. In this example, in the cap 15, an outer circumferential surface of the disk-like fluorescent member 16 is held by a translucent member 17 as shown in FIG. 1B.

As described above, according to the light-emitting device of the first embodiment, the output emitted light of the light-emitting element 12 is made directly incident on the fluorescent member 16 at the central part of the cap, and light emitted by the fluorescent substance excited by the incident light is output to the outside in front of the reflector. At this time, the light emitted by the fluorescent substance may be color-mixed with the output emitted light of the light-emitting element 12. It becomes possible for the light emitted by the fluorescent member 16 in the direction of the support body to pass through the translucent member 17 around the fluorescent member and to be efficiently output to the front of the reflector after being reflected by the light reflection surface 14a and a top surface of the support body, thereby improving the outcoupling efficiency of light. A diffusion material for diffusing the emitted output light of the light-emitting element 12 may be mixed in the fluorescent member 16. Thus, the directivity can be improved.

Further, in this embodiment, the directivity of the emitted output light of the light-emitting element 12 is high and thus the area of the fluorescent member 16 to be excited by the light from the light-emitting element 12 can be made small. Consequently, a ratio of the intensity of light to the light emission area becomes larger, and a higher luminance can be achieved. Further, the outer circumference of the fluorescent member 16 is firmly held by the translucent member 17, and hence even when the fluorescent member 16 is irradiated with high-energy light, the fluorescent member does not come off.

Further, when the plane shape of the fluorescent member 16 coincides with a cross sectional beam pattern shape of the emitted output light from the light-emitting element 12 on the irradiated surface, the entire emitted output light of the light-emitting element 12 is uniformly wavelength-converted, and hence there is no possibility of color irregularity being caused at the fluorescent member 16. Conversely, if the light-emitting element 12 is a chip of a surface-emitting LED, only a part of the emitted output light illuminates the fluorescent member 16 to be wavelength-converted, and hence there is the possibility of color irregularity being caused between the irradiated part and a peripheral part thereof.

Incidentally, the plane shape of the fluorescent member 16 is not limited to the circular shape shown in FIG. 1B, and is made to have a shape corresponding to the cross sectional beam pattern shape (for example, an elliptic shape) of the emitted output light from the light-emitting element on the irradiated surface, whereby it becomes possible to make the fluorescent substance emit light efficiently and to obtain output light with high intensity. In this case, the plane shape of the fluorescent member 16 may be made to completely coincide with the cross sectional beam pattern shape of the emitted output light from the light-emitting element 12 on the irradiated surface. However, the plane shape of the fluorescent member 16 may also be set larger or smaller than the pattern shape of the beam cross section. Further, the fluorescent member 16 may have a difference in the wavelength conversion capability in the plane. For example, the amount of the fluorescent substance may be distributed in such a state that the amount of the fluorescent substance is denser at the central part of the pattern shape of the beam cross section than at the peripheral part thereof.

Each of the constituent elements of the above-mentioned light-emitting device will be described below in detail.

(Support body 11) The support body is made of a metallic material or an insulating substrate excellent in thermal conductivity with a plurality of lead terminals 10 attached thereto. It is desirable that a film of high reflectance (not shown) be formed on the surface of the support body.

(Light-emitting element 12) The number of light-emitting elements mounted and installed on the support body is arbitrary, and may be one or more. A pair of electrodes of the light-emitting element is electrically connected each to a single lead terminal of the support body. In this case, one of the electrode surfaces of the light-emitting element is connected to one lead terminal by die bonding, and the other electrode surface of the light-emitting element is connected to another lead terminal through a conductive wire.

The output structure of the light-emitting element is arbitrary and may be, for example, of a surface-emitting, of an edge-emitting, or of a ridge array. For example, a light-emitting element for emitting blue light having an emission peak wavelength in the vicinity of 460 nm, a light-emitting element for emitting bluish purple light having an emission peak wavelength in the vicinity of 410 nm, a light-emitting element for emitting ultraviolet light having an emission peak wavelength in the vicinity of 365 nm, and the like can be used.

The type of the light-emitting element is not particularly limited. However, for example, a light-emitting element having a structure obtained by forming a nitride semiconductor such as InN, AlN, GaN, InGaN, AlGaN, InGaAlN, and the like as a light-emitting layer on a substrate by MOCVD method or the like is used. For example, a light-emitting element having a structure formed by stacking an n-type contact layer made of n-type GaN, an n-type cladding layer made of n-type AlGaN, and a p-type contact layer made of p-type GaN one on top of another in this order on a sapphire substrate is used. The emission wavelength of the light-emitting element can be variously selected according to the material of the semiconductor and the mixed crystal ratio thereof. For example, by changing the InGaN content or type of impurities with which the active layer is doped, it is possible to change the emission wavelength from the ultraviolet region to the red region.

(Covering member 13) High transparency for light is required to the covering member in order to allow the light from the light-emitting element to efficiently pass therethrough. Incidentally, in the structure in which the electrode of the light-emitting element and the terminal on the support body are connected to each other by a conductive wire, the covering member also serves to protect the conductive wire. As a material used for the covering member, translucent resin excellent in weather resistance such as epoxy resin, silicone resin, acrylic resin, urea resin, and the like or glass excellent in light resistance is suitably used. Further, when the translucent resin contains a diffusing agent such as silicon dioxide or aluminum oxide, it is also possible to lower the directivity of light from the light-emitting element and to make the view angle wider.

(Reflector 14) The material of the reflector is not particularly limited, and the light reflection surface 14a can be formed into an arbitrary shape, such as a gradual curve, cup-like shape, or tapered shape.

(Cap 15) The cap includes in at least a part thereof a solid fluorescent member 16 containing a fluorescent substance which is excited by light from the light-emitting element and emits light having a color different from the color of the light emitted by the light-emitting element. An example of the cap includes a circular opening at, for example, a central part of a circular ring-like translucent member (for example, translucent member) as shown in FIG. 1B, and the solid fluorescent member 16 containing a fluorescent substance is present at the central opening.

(Solid fluorescent member 16) An example of the solid fluorescent member is that formed by binding a fluorescent substance using a binder such as glass, which is an inorganic material, and hardening the bound fluorescent substance. In this example, fluorescent glass formed by binding the fluorescent substance with glass is used. Incidentally, in an example of a method of forming a cap 15 including a fluorescent member 16 at least a part thereof, a fluorescent substance is arranged on a bottom surface of a cap-forming container at, for example, a central part thereof, and after filling the peripheral part with molten glass, the resultant is hardened.

(Fluorescent substance) The fluorescent substance absorbs light from the light-emitting element, and converts the light into light having a different wavelength, and a YAG fluorescent substance, a nitride fluorescent substance, and other fluorescent substances can be used as the fluorescent substance. It is desirable that the fluorescent substance is at least one substance selected from, for example, a nitride-based fluorescent substance/oxynitride-based fluorescent substance mainly activated with lanthanoid such as Eu and Ce; an alkaline-earth halogen apatite fluorescent substance, alkaline-earth metal boric acid halogen fluorescent substance, alkaline-earth metal aluminate fluorescent substance, an alkaline-earth silicate, alkaline-earth sulfide, alkaline-earth thiogallate, alkaline-earth silicon nitride, and germanate mainly activated with lanthanoid such as Eu or transition metal such as Mn; a rare-earth aluminate and rare-earth silicate mainly activated with lanthanoid such as Ce; and organic and inorganic complexes mainly activated with lanthanoid such as Eu.

As the fluorescent substances, fluorescent substances exhibiting emission spectra corresponding to yellow, red, green, and blue when excited by the light from the light-emitting element can be used. In addition, fluorescent substances having spectra corresponding to neutral colors of these colors, e.g., yellow, bluish green, orange, and the like can also be used. When these fluorescent substances are variously combined with each other, light-emitting devices having various luminescent colors can be manufactured.

Accordingly, when, for example, a GaN-based compound semiconductor which emits blue light is used as a light-emitting element, $Y_3Al_5O_{12}$:Ce or $(Y_{0.8}Gd_{0.2})_3Al_5O_{12}$:Ce is used as a fluorescent substance, and wavelength conversion is performed by irradiating a YAG fluorescent substance with light from the light-emitting element, it is possible to provide a light-emitting device which emits whitish mixed color obtained by mixing the light from the light-emitting element and light from the fluorescent substance.

(Translucent member 17) The translucent member is made of, for example, translucent member, regardless of whether or not an HR coat or an AR coat for protection against light emitted by the LD chip is present.

Second Embodiment

FIG. 7 is a partial cross-sectional side view schematically showing an example of a light-emitting device according to a second embodiment. This light-emitting device includes, as main constituent elements, a support body 11 provided with lead terminals 10, a light-emitting element (an LD chip in this example) 12 mounted on the support body at a central part thereof, a translucent covering member 13 covering (sealing) the light-emitting element, a receptacle 71, a convergent lens 72, and a solid fluorescent member 73 containing a fluorescent substance and having a convex lens-like shape.

The receptacle 71 is constituted by, for example, a cylindrical metallic body, has a proximal side fixed to the periphery of the support body 11, is placed to surround the circumference of the light-emitting element 12, and has a cup section 71a, for example, integral therewith and protruding from an intermediate part of the inner surface. In the cup section 71a, a light-transmitting opening (aperture) 71b is formed at the central part thereof, and a light reflection surface 71c having, for example, a hemispherical (or tapered) shape opened on the side of the distal end of the receptacle is formed. Further, the fluorescent member 73 is placed to cover the distal end face of the cup section 71a on the side of the opening. Further, the convergent lens 72 is placed within the space in the receptacle at a position closer to the light-emitting element side than the cup section 71a and allows light from the light-emitting element to converge and the light to pass through the aperture 71b so as to make the light incident on the fluorescent member 73.

Here, the support body 11 and the light-emitting element 12 are the same as those previously described in the first embodiment, and the solid fluorescent member 73 is, for example, fluorescent glass. Further, the light reflection surface 71c of the cup section 71a of the receptacle can be formed into an arbitrary shape, such as a gradual curve, cup-like shape, and tapered shape.

According to the configuration of FIG. 7, by positioning the aperture 71b of the cup section 71a in the vicinity of the focal point of the convergent lens 72, even when the aperture 71b is made small, it is possible to allow the converging light as it is pass through the aperture 71b to excite the fluorescent substance of the fluorescent member 73. At this time, a ratio of a light component (return light) which returns to the light-emitting element side through the small aperture 71b with respect to the total light emitted by the excited fluorescent substance becomes very small, and most of the light emitted by the fluorescent substance is directly output to the front of the receptacle or is reflected by the light reflection surface 71c to be output to the front of the receptacle, thereby achieving high-luminance output emission. Further, it is possible to form the fluorescent member 73 in a large size such that the front surface of the fluorescent member 73, which covers the distal end face of the cup section 71a on the side of opening, protrudes from the distal end of the receptacle. Thus, the load on the fluorescent substance is lowered, the saturation intensity of the excitation light that induces emission is increased, and the luminous efficiency and linearity are improved.

Third Embodiment

Figure 9:
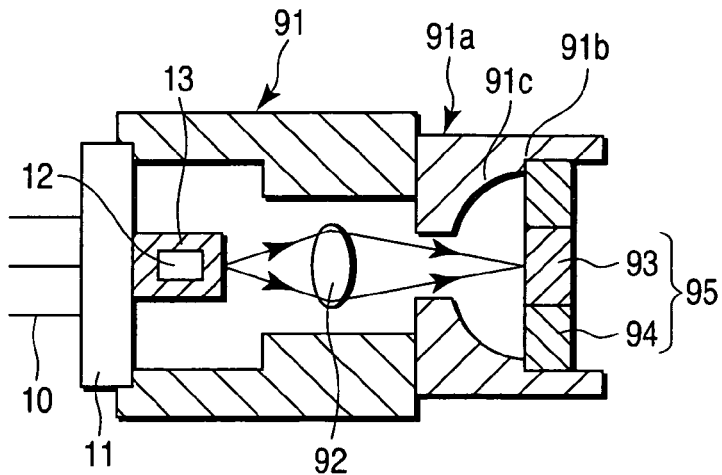
FIG. 9 is a partial cross-sectional side view schematically showing an example of a light-emitting device of Example 9.

FIG. 9 is a side view schematically showing an example of a light-emitting device of a solid fluorescent member mounting type according to a third embodiment. This light-emitting device includes, as main constituent elements, a support body 11 provided with lead terminals 10, a light-emitting element (an LD chip in this example) 12 mounted on the support body at a central part thereof, a translucent covering member 13 covering (sealing) the light-emitting element, a receptacle 91, a cup 91a formed separately from the receptacle, a convergent lens 92, and a cap 95 provided with a solid fluorescent member 93 at a central part thereof. Here, the receptacle 91 is constituted by, for example, a cylindrical metallic body, a distal end part thereof is formed thick, and the cup 91a is fixed (for example, welded) to an end face surrounding an opening of the receptacle 91 in such a state that the cup 91a faces and is in contact with the end face. Further, the distal end part of the light reflection surface 91c is provided with a step section 91b at a position near the intermediate part of the cup 91a. Further, the cap 95 is fixed to a bottom surface of the step section 91b, and is placed to cover the opening part (inside the distal end at the opening of the receptacle) of the cup 91a. Incidentally, in this example, in the cap 95, the circumferential surface of the disk-like fluorescent member 93 is held by a translucent member 94.

According to the configuration of FIG. 9, even when the fluorescent member 93 at the central part of the cap 95 is made smaller, the cup section 91a can be fixed in the state that an alignment desired for making the light from the convergent lens 92 incident on the small fluorescent member 93 has been achieved. Further, the open distal end part of the receptacle that protrudes from the step section 91b of the cup section 91a serves to increase the directivity of the output light.

Fourth Embodiment

Figure 10:
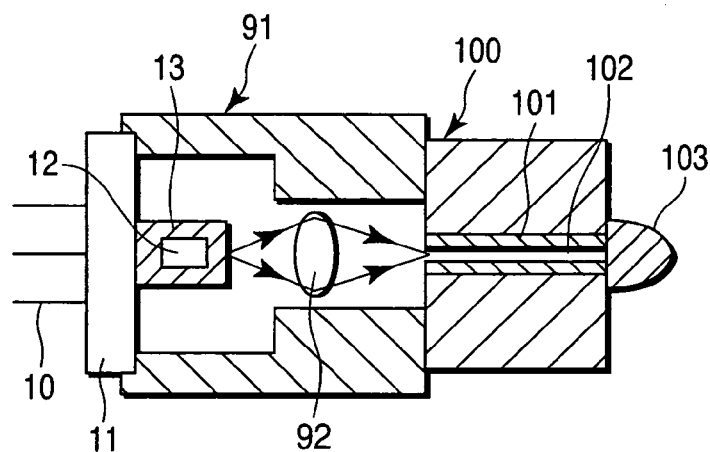
FIG. 10 is a partial cross-sectional side view schematically showing an example of a light-emitting device of Example 10.

FIG. 10 is a side view schematically showing an example of a light-emitting device of a solid fluorescent member mounting type according to a fourth embodiment. The light-emitting device shown in FIG. 10 differs from the light-emitting device of FIG. 9 described previously in the respect that a light guide 100 formed separately from a receptacle 91 is fixed to an end face of a receptacle surrounding an opening thereof instead of the cup 91a and the cap 95. This light guide 100 includes a ferrule 101 made of metal and provided with a thin optical fiber insertion hole at a central part thereof and a flexible light guide member (for example, an optical fiber 102) inserted into the central part of the ferrule. Further, a small solid fluorescent member 103 is held at or attached to an end face of the optical fiber 102, and the ferrule is fixed in the state that a proximal end face thereof faces and is in contact with the distal end face of the receptacle surrounding the opening thereof.

According to the configuration of FIG. 10, the light guide 100 can be fixed in the state that an alignment desired for making the converging light incident on one end face of the optical fiber 102 has been achieved. The light incident on the end face of the optical fiber 102 is further made incident on the fluorescent member 103 at the end face part of the optical fiber through the optical fiber 102, and hence high-luminance output emission can be obtained. Further, replacement of the light guide 100, ferrule 101, optical fiber 102, and fluorescent member 103 can be made easily, and a mounting yield is also improved. Incidentally, the ferrule 101 may be omitted, and the light guide member may be held such that the proximal end face of the light guide member faces and is in contact with the distal end face of the receptacle surrounding the opening thereof.

Fifth Embodiment

Figure 11:
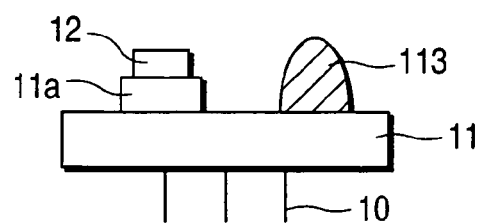
FIG. 11 is a partial cross-sectional side view schematically showing an example of a light-emitting device of Example 11.

FIG. 11 is a side view schematically showing an example of a solid fluorescent member-mounting type light-emitting device according to a fifth embodiment. The light-emitting device shown in FIG. 11 includes, as main constituent elements, a support body 11 provided with lead terminals 10, a sub-mount 11a placed on the support body, a light-emitting element (an LD chip in this example) 12 mounted on the sub-mount, and a solid fluorescent member (for example, fluorescent glass) 113 placed on the support body 11 and having a hemispherical cross section (lamp-shaped, shell-shaped). In this case, the light-emitting element 12 is mounted in the state that output light is emitted sideways, and the fluorescent glass 113 is placed to face the light-emitting element 12. As a result of this, the light from the light-emitting element 12 is made directly incident on the fluorescent member 113 to excite the fluorescent substance, and the light emitted by the fluorescent substance and the light from the light-emitting element 12 are output to the upward position of the support body 11.

According to the configuration of FIG. 11, the number of members used is small, and the number of steps necessary for assembly is also small, and hence high-luminance output emission can be obtained while the manufacturing cost can be reduced. Particularly, the light-emitting element 12 and the fluorescent member 113 are directly arranged on the support body 11, whereby it becomes possible to efficiently radiate heat generated from the light-emitting element 12 and the fluorescent member 113, and the thermal resistance of the heat radiation path is reduced. As a result of this, the load on the light-emitting element 12 and the fluorescent member 113 is decreased, thus improving the luminous efficiency and linearity. Further, the light emitted by the light-emitting element 12 has directivity, and hence it becomes possible to efficiently irradiate the small fluorescent member 113 with light, thereby improving the luminance.

EXAMPLES

Some examples will be described below for a light-emitting device of the present invention.

Example 1

FIG. 1A schematically shows the structure of a light-emitting device of Example 1. This light-emitting device is a specific example of the first embodiment described previously, and includes a support body 11 provided with lead terminals 10, an LD chip 12, translucent resin 13, a cylindrical reflector 14 constituted by, for example, a metallic body, and a cap 15. Incidentally, the LD chip 12 is mounted on the support body at, for example, a central part thereof such that it emits output light in the direction of the distal end of the reflector on the side of the opening.

As shown in FIG. 1B, the cap 15 is provided with a circular opening at a central part of a translucent member plate 17 having a circular ring-like shape, and a solid fluorescent glass 16 is present in the opening at the center. A proximal end part of the reflector 14 is fixed to periphery of the support body 11, and periphery of the cap 15 is fixed to a bottom surface of a step section 14b formed on the inside of the distal end part of the reflector.

According to the configuration of FIG. 1A, the output light emitted by the LD chip 12 is made directly incident on the fluorescent glass 16 at the central part of the cap, and the light emitted by the fluorescent substance excited by the incident light is output to the front of the reflector. In this case, the area of the fluorescent glass 16 is small, and hence realization of high luminance is enabled. Further, it becomes possible for the light emitted by the fluorescent glass 16 in the direction of the support body to pass through the translucent member plate 17 around the fluorescent glass, and be efficiently output to the front of the reflector after being reflected by a light reflection surface 14a and a top surface of the support body, thereby improving the outcoupling efficiency of the light.

Example 2

Figure 2B:
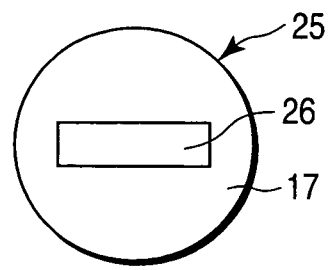
FIG. 2B is a plan view schematically showing an example of a cap used in the light-emitting device of FIG. 2A.

FIG. 2A schematically shows the structure of a light-emitting device of Example 2. This light-emitting device differs from the light-emitting device previously described with reference to FIG. 1A in the respect that the device includes an LD array in which a plurality of (for example, two) LD chips 12 are arranged and mounted, and a cap 25 is provided with a rectangular opening at a central part thereof as shown in FIG. 2B, and a fluorescent glass 26 is present at the rectangular opening.

According to the configuration of FIG. 2A, the same effect as that previously described for the light-emitting device with reference to FIGS. 1A and 1B can be obtained. Furthermore, when the fluorescent glass 26 of the cap 25 is provided in accordance with an emergence pattern of the light from the LD chip 12, it becomes possible to make the fluorescent substance efficiently emit light and to obtain high-luminance output light.

When the LD array has a characteristic of emitting light in an irradiation pattern in which the light beam is more expanded in the vertical direction than in the horizontal direction, it is possible to form the fluorescent glass 26 into an elliptic shape in accordance with the characteristic. Further, the opening of the cap 25 may be a thin and long opening. Alternatively, a plurality of short rectangular openings may be formed in an array in accordance with irradiation patterns of light beams from the LD chips 12, and a fluorescent glass 26 may be arranged at each of the openings.

Example 3

Figure 3:
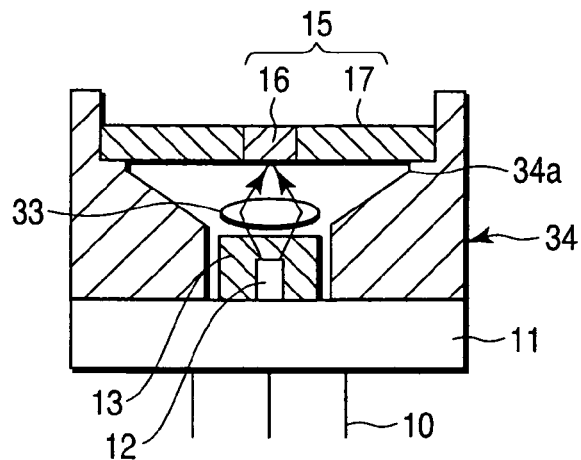
FIG. 3 is a partial cross-sectional side view schematically showing an example of a light-emitting device of Example 3.

FIG. 3 schematically shows the structure of a light-emitting device of Example 3. This light-emitting device differs from the light-emitting device previously described with reference to FIG. 1A in the respect that a light reflection surface 34a of a reflector 34 is, for example, hemispherical, and that a convergent lens 33 for making light from an LD chip 12 convergent and the converging light incident on a fluorescent glass 16 (the lens has a focal point at a position of the fluorescent glass 16) is placed within the space surrounded by the reflector 34.

According to the configuration of FIG. 3, the same effect as that previously described for the light-emitting device with reference to FIGS. 1A and 1B can be obtained, and further, it is possible to make the light from the LD chip 12 convergent by means of the convergent lens 33 and make the converging light incident on the fluorescent glass 16. This makes it possible to make the fluorescent glass 16 small and enhance the intensity of light for exciting the fluorescent substance, thereby improving the luminance.

Example 4

Figure 4:
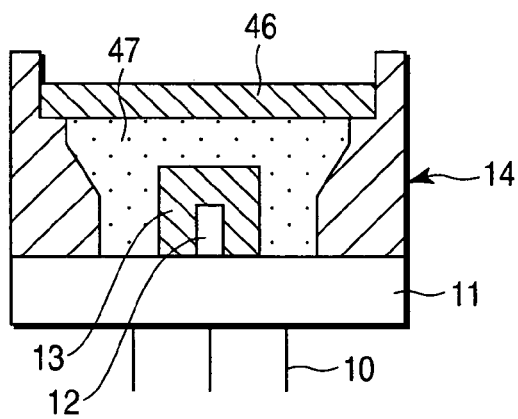
FIG. 4 is a partial cross-sectional side view schematically showing an example of a light-emitting device of Example 4.

FIG. 4 schematically shows the structure of a light-emitting device of Example 4. This light-emitting device differs from the light-emitting device previously described with reference to FIG. 1A in the respect that a solid fluorescent glass 46 constituted only by a fluorescent member and having a disk-like shape is used instead of the cap 15, and that an LD chip 12 is sealed with low-melting glass 47 inside the reflector 14. It is possible that the low-melting glass 47 is not be used and the inside of the reflector 14 is filled with an inorganic binder or inert gas such as $N_2$ and Ar.

According to the configuration of FIG. 4, the output light emitted by the LD chip 12 is made directly incident on the fluorescent glass 46, and the light emitted by the excited fluorescent substance is output to the outside (the front of the reflector). At this time, the light emitted by the fluorescent substance may be color-mixed with the output light emitted by the LD chip 12. Further, since the fluorescent glass 46 is placed to cover the entire surface of the reflector opening and the light from the LD chip 12 is made incident on the entire surface of the fluorescent substance, the load on the fluorescent substance is lowered and the luminous efficiency and linearity are improved.

Further, the inside of the reflector 14 is sealed with low-melting glass 47, and hence the refractive index of the fluorescent glass 46 and the refractive index inside the reflector can be matched with each other. As a result of this, it becomes possible to efficiently guide the light from the LD chip 12 to the fluorescent glass 46, which improves the luminance. Further, the LD chip 12 is sealed with low-melting glass 47 inside the reflector, and hence it is possible to protect the LD chip 12 from external impact, moisture, and the like. Further, the fluorescent glass 46 is placed to cover the entire surface of the opening of the reflector 14, and the light from the LD chip 12 can be made incident on the entire surface of the fluorescent substance, and hence it becomes possible to obtain higher-luminance output light.

Incidentally, the fluorescent glass 46 is made to be thicker than the peak wavelength (for example, 445 nm) of the output light emitted by the LD chip 12, and hence it is possible for the fluorescent substance to be excited by the light from the LD chip 12 and emit light. By setting the thickness of the fluorescent glass 46 at about 100 μm to 500 μm, a degree of light diffusion is improved, and color irregularity of the emitted output light is reduced.

Example 5

Figure 5:
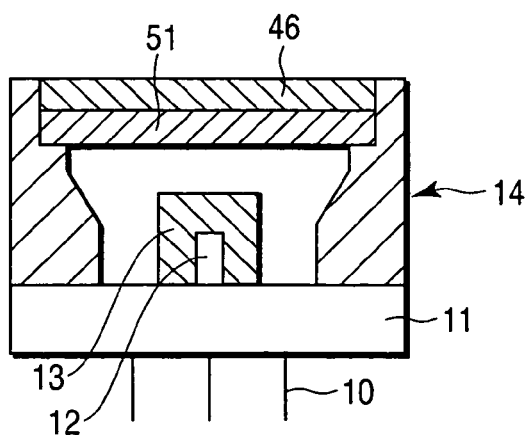
FIG. 5 is a partial cross-sectional side view schematically showing an example of a light-emitting device of Example 5.

FIG. 5 schematically shows the structure of a light-emitting device of Example 5. This light-emitting device differs from the light-emitting device previously described with reference to FIG. 4 in the following respects. Sealing using the low-melting glass 47 is not performed. Further, a periphery of a highly thermal conductive member 51 having a plate-like shape is fixed to and held on a bottom surface (distal end face of reflector) of a step section of a reflector 14 so as to cover a distal end face of the reflector 14 surrounding an opening thereof. Further, a disk-like fluorescent glass 46 is laid on the front side of the member 51 so as to be fixed thereto. The arrangement order of the highly thermal conductive member 51 and the fluorescent glass 46 may be reversed.

According to the configuration of FIG. 5, in addition to the same effect as that previously described for the light-emitting device of FIG. 4, the following effects can be obtained. The highly thermal conductive member 51 is placed to cover the opening part of the reflector. In this example, the inside of the reflector is sealed with a double cap structure constituted by the highly thermal conductive member 51 and the fluorescent glass 46, and hence the LD chip 12 is not adversely affected by moisture and the like. Further, it becomes possible to efficiently radiate heat generated from the fluorescent glass 46 by the highly thermal conductive member 51, and hence the load on the fluorescent glass 46 is lowered, and the luminous efficiency and linearity are improved.

Example 6

FIG. 6 schematically shows the structure of a light-emitting device of Example 6. This light-emitting device differs from the light-emitting device of FIG. 5 described previously in the respect that a functional filter 61 is placed on the undersurface side of a fluorescent glass 46 and between the fluorescent glass 46 and a highly thermal conductive member 51. This functional filter 61 is constituted by a multilayer film of dielectric substances having a high reflectance characteristic with respect to light (light having a wavelength longer than that of the excitation light emitted by an LD chip 12) other than the light from the LD chip 12. An example of the specific material is a material containing at least one selected from $SiO_2$, $ZrO_2$, $Al_2O_3$, AlN, ZnO, $TiO_2$, SiN, $Ta_3O_5$, $MgF_2$, $Si_3N_4$, MgO, $HfO_2$, and $Nb_2O_5$.

According to the configuration of FIG. 6, the same effect as that previously described for the light-emitting device of FIG. 5 can be obtained. Further, the functional filter 61 arranged to cover the opening section of the reflector makes it possible to reflect light returning from the fluorescent glass 46 to the LD chip side and efficiently output light to the front of the reflector. Incidentally, when the functional filter 61 is placed on the top surface side (front side of the reflector) of the fluorescent glass 46, it becomes possible to reflect any excitation light that was not used to excite the fluorescent substance back towards the fluorescent glass 46 side, thereby improving the outcoupling efficiency of the light.

Example 7

FIG. 7 schematically shows the structure of a light-emitting device of Example 7, which is a specific example of the second embodiment described previously. This light-emitting device includes a support body 11 provided with lead terminals 10, an LD chip 12 mounted on the support body at a central part thereof, a translucent covering member 13 covering (sealing) the LD chip, a cylindrical receptacle 71 constituted by a metallic body, a convergent lens 72, and a fluorescent glass 73.

The receptacle 71 is fixed at, for example, the proximal end side thereof to the periphery of the support body 11, and is placed to surround the LD chip 12. In the receptacle 71, a cup section 71a integral therewith and protruding from an intermediate part of the inner surface is formed. In the cup section 71a, an aperture 71b is formed at the central part thereof, and a light reflection surface 71c having, for example, a hemispherical (or tapered) shape open at the distal end of the receptacle is formed. Further, an inner surface of the distal end part of the receptacle and a distal end surface of the cup section form a step section. The fluorescent glass 73 having, for example, a convex lens-like shape is placed to cover the surface of the distal end of the cup section 71a surrounding the opening thereof. The periphery of the fluorescent glass 73 is fixed to the distal end face (bottom surface of the step section) of the cup section so as to be held. Further, the convergent lens 72 is placed within the space inside the receptacle closer to the LD chip side than the cup section 71a. The convergent lens 72 allows the light from the LD chip 12 to converge and the converging light to pass through the aperture 71b so as to make the light incident on the fluorescent glass 73.

Here, the support body 11 and the LD chip 12 are the same as those previously described in Example 1. Further, the light reflection surface 71c of the cup section 71a of the receptacle 71 can be formed into an arbitrary shape, such as a gradual curve, cup-like shape, or tapered shape.

According to the configuration of FIG. 7, by positioning the aperture 71b of the cup section 71a of the receptacle in the vicinity of the focal point of the convergent lens 72, even when the aperture 71b is made small, the converging light as it is can pass through the aperture 71b. As a result of this, it is possible to make the light from the LD chip 12 excite the fluorescent substance of the fluorescent glass 73, and obtain high-luminance output emission.

Accordingly, a ratio of return light (light which passes through the small aperture to return to the LD chip side) with respect to the total light emitted by the excited fluorescent substance becomes very small, and most of the light is directly output to the front of the receptacle or is reflected by the light reflection surface 71c to be output to the front of the receptacle.

Further, it is possible to form the fluorescent glass 73 in a large size as a cap covering the distal end face of the cup section 71a surrounding the opening such that the front surface of the fluorescent glass 73 having the lens (for example, a convex lens)-like shape protrudes from the distal end of the receptacle. As a result of this, the load on the fluorescent substance is lowered, the saturation intensity of the excitation light that induces emission is increased, and the luminous efficiency and linearity are improved.

Example 8

FIG. 8 schematically shows the structure of a light-emitting device of Example 8. In this light-emitting device, a cap 15 similar to that described in the first embodiment is used instead of the convex lens-like fluorescent glass 73 of the light-emitting device previously described with reference to FIG. 7. In this cap 15, a fluorescent glass 16 is placed at a central part of a disk-like translucent member (for example, a translucent member plate 17) as shown in, for example, FIG. 1B.

According to the configuration of FIG. 8, by positioning the fluorescent glass 16 in the vicinity of the focal point of a convergent lens 72, it is possible to make the light from the convergent lens 72 incident on the fluorescent glass 16, excite the fluorescent substance, and make the fluorescent substance emit output light to the front of the receptacle. In this case, the area of the fluorescent glass 16 is small, and hence high luminance can be realized. Further, it becomes possible for the light emitted by the fluorescent glass 16 to the inside of the cup section 71a to pass through the translucent member plate 17 around the fluorescent glass and efficiently output to the front of the receptacle after being reflected by a light reflection surface 71c of the cup section 71a, thereby improving the outcoupling efficiency of the light.

Example 9

FIG. 9 schematically shows the structure of a light-emitting device of Example 9 which is a specific example of the third embodiment described previously. This light-emitting device differs from the light-emitting device previously described with reference to FIG. 8 in the respect that a distal end part of a receptacle main body 91 is formed thick, a cup 91a is formed separately from the receptacle main body 91, and the cup 91a is fixed (for example, by welding) to an end face of the receptacle main body 91 surrounding an opening thereof in such a state that the cup 91a faces and is in contact with the end face. Further, a step section 91b is formed at a position near the intermediate part of the cup 91a and at the distal end part of the light reflection surface 91c. Further, a cap 95 is fixed to a bottom surface of the step section 91b, and is placed to cover the opening part (inside the distal end at the opening of the receptacle) of the cup 91a.

According to the configuration of FIG. 9, even when the fluorescent glass 93 at the central part of the cap 95 is made smaller, it is possible to fix the cup 91a in the state that an alignment desired for making the light from the convergent lens 92 incident on the small fluorescent glass 93 has been achieved. Further, the open distal end part of the receptacle that protrudes from the step section of the cup section 91a serves to increase the directivity of the output light.

Example 10

FIG. 10 schematically shows the structure of a light-emitting device of Example 10, which is a specific example of the fourth embodiment described previously. This light-emitting device differs from the light-emitting device previously described with reference to FIG. 9 in the respect that a light guide 100 formed separately from a receptacle (holding member) 91 is fixed to a periphery of a receptacle surrounding an opening thereof instead of the cup 91a and the cap 95. This light guide 100 includes a ferrule 101 made of metal, and a light guide member (an optical fiber 102 in this example). Further, a small fluorescent glass 103 is held at an end face of the optical fiber 102 in the state that the fluorescent glass 103 is pressed against the optical fiber end face side by, for example, a spring (not shown). The ferrule 101 is provided with a thin optical fiber insertion hole at a central part thereof, and the optical fiber 102 is inserted into the central part of the ferrule. Further, the ferrule is fixed in the state that a proximal end face of the ferrule faces and is in contact with the distal end face of the receptacle surrounding the opening thereof.

According to the configuration of FIG. 10, the light guide 100 can be fixed in the state that alignment with respect to the receptacle 91 has been achieved such that the light, which the convergent lens 92 has made converge, incident on one end face of the optical fiber 102. The light incident on the end face of the optical fiber 102 is further made incident on the fluorescent glass 103 at the end face part of the optical fiber through the optical fiber 102, and hence high-luminance output emission can be obtained. Further, replacement of the light guide 100, ferrule 101, optical fiber 102, and fluorescent glass 103 can be made easily, and a mounting yield is also improved. Incidentally, since the optical fiber 102 is thin, the amount of return light from the fluorescent glass 103 on the distal end face side to the LD chip side is small.

Example 11

FIG. 11 schematically shows the structure of a light-emitting device of Example 11, which is a specific example of the fifth embodiment described previously. This light-emitting device includes a support body 11 provided with lead terminals 10, a sub-mount 11a placed on the support body, an LD chip 12 mounted on the sub-mount in the state that output light is emitted sideways, and a fluorescent glass 113 placed on the support body 11 to face the LD chip 12 and having a hemispherical cross section (lamp-shaped, shell-shaped). As a result of this, the light from the LD chip 12 is made directly incident on the fluorescent glass 113 to excite the fluorescent substance, and the light emitted by the fluorescent substance and the light from the LD chip 12 are output upwardly above the support body 11.

According to the configuration of FIG. 11, the number of members used is small, and the number of steps necessary for assembly is also small, and hence high-luminance output emission can be obtained while the manufacturing cost can be reduced. Particularly, the LD chip 12 and the fluorescent glass 113 can be directly arranged on the support body 11, whereby it becomes possible to efficiently radiate heat generated from the LD chip 12 and the fluorescent glass 113, and the thermal resistance of the heat radiation path is reduced. As a result of this, the load on the LD chip 12 and the fluorescent glass 113 is lowered, and the luminous efficiency and linearity are improved. Further, the light emitted by the LD chip 12 has directivity, and hence it becomes possible to efficiently irradiate the small fluorescent glass 113 with light, thereby improving the luminance.

Example 12

FIG. 12 schematically shows the structure of a light-emitting device of Example 12. This light-emitting device differs from the light-emitting device of FIG. 11 described previously in the respect that a flat plate-like fluorescent glass 123 is placed on a support body 11, and an LD chip 12 is mounted on the fluorescent glass 123 in the state that output light of the LD chip is emitted in the downward direction. As a result of this, the light from the LD chip 12 is made directly incident on the fluorescent glass 123 below the LD chip 12 so as to excite the fluorescent substance, and the light emitted by the fluorescent substance is output upwardly above the support body. According to the configuration of FIG. 12, the same effect as that previously described for the light-emitting device with reference to FIG. 11 can be obtained.

Example 13

FIG. 13 schematically shows the structure of a light-emitting device of Example 13. This light-emitting device differs from the light-emitting device of FIG. 12 described previously in the respect that an LD chip 12 is directed obliquely downward on a holding pedestal 131 mounted on the support body 11, and light from the LD chip 12 is made directly incident on a fluorescent glass 133 obliquely below the LD chip 12.

According to the configuration of FIG. 13, the same effect as that previously described for the light-emitting device with reference to FIG. 11 can be obtained. Further, the light emitted by the fluorescent substance of the fluorescent glass 133 is output in the upward and lateral directions above the support body without being intercepted by the LD chip 12 obliquely above the glass body 133 and the holding pedestal 131, and hence the outcoupling efficiency of the light is improved.

Example 14

FIG. 14 schematically shows the structure of a light-emitting device of Example 14. In this light-emitting device, a double edge-emitting LD chip 142 is used. In the double edge-emitting LD chip 142, output light can be obtained from both edges in an arbitrary ratio by controlling the reflectance of each of the mirrors on both edges of the chip. Further, the LD chip 142 is mounted on a support body 11 provided with lead terminals 10 in the state that both emission edges faces the right and left sides, and two fluorescent glass 143 having a dome-like (lamp-like, shell-like) shape are arranged on both sides of the LD chip 142 so as to face the LD chip. The fluorescent glass 143 can be formed into an arbitrary shape such as a dome-like shape, and a square pillar-like shape. As a result of this, it is possible to make the light from the LD chip 142 directly incident on each of the fluorescent glass 143 on both sides and excite each of the fluorescent glass 143 so as to make each of them emit light.

According to the configuration of FIG. 14, the same effect as that previously described for the light-emitting device with reference to FIG. 11 can be obtained. Moreover, the load on the fluorescent substance is lowered, and the luminous efficiency and linearity are improved. Incidentally, by using fluorescent substances different from each other in the two fluorescent glass 143, it is possible to make the fluorescent glass 143 emit light components having wavelengths different from each other without causing the interference of the light components emitted by the two fluorescent glass.

Example 15

FIG. 15 schematically shows the structure of a light-emitting device of Example 15. In this light-emitting device, an LD chip 12 is mounted on a support body 11 provided with lead terminals 10 such that the LD chip 12 emits output light upwardly above the support body, and flat plate-like fluorescent glass 153 are arranged on both sides or around the LD chip 12. Further, a cylindrical reflector 151 is fixed on the support body 11 so as to cover the LD chip 12 and the fluorescent glass 153, and, as a cap for closing the distal end opening of the reflector 151, for example, a glass plate 152 is held thereon. On a part of the inner surface or the entire inner surface of the glass plate 152, a reflection film (not shown) for reflecting light from the LD chip 12 is formed. As a result of this, the light from the LD chip 12 is reflected by the inner surface of the glass plate 152 above the LD chip 12, and the reflected light is made incident on the fluorescent glass 153 to excite the fluorescent substance. Light emitted by the fluorescent substance passes through the glass plate 152 and is output upwardly above the support body directly or after being reflected by the inner surface of the reflector 151.

According to the configuration of FIG. 15, the same effect as that previously described for the light-emitting device with reference to FIG. 11 can be obtained, and further the emission surface can be made uniform.

Example 16

FIG. 16 schematically shows the structure of a light-emitting device of Example 16. In this light-emitting device, an LD chip 12 is mounted on a support body 11 provided with lead terminals 10 such that the LD chip 12 emits output light upwardly above the support body, and a dome-like fluorescent glass 163 is arranged to cover the LD chip 12. As a result of this, the light from the LD chip 12 is made incident on the fluorescent glass 163 to excite the fluorescent substance, and the light emitted by the fluorescent substance passes through the fluorescent glass 163 to be output to the outside of the dome directly or after being reflected by the surface of the support body.

According to the configuration of FIG. 16, the same effect as that previously described for the light-emitting device with reference to FIG. 11 can be obtained, and moreover, the outcoupling efficiency is improved.

The light-emitting device of the present invention can be applied to a light source for illumination, a light source for various indicators, an onboard light source, a light source for a display, a light source for a backlight of a liquid crystal display, and the like.

What is claimed is:

1. A light-emitting device comprising:
   a disk shaped support body;
   a light-emitting element constituted by a laser diode mounted on the support body;
   a cylindrical reflector, having openings at opposite ends, fixed to the support body to close one of said opposite ends and provided with a light reflection surface on its inner surface surrounding the light-emitting element; and
   a cap having a wavelength conversion member positioned at an interior portion of the cap, and a translucent member surrounding the wavelength conversion member, the wavelength conversion member extending completely through the cap and emitting light having a wavelength different from that of the light emitted by the light-emitting element when irradiated with light from the light-emitting element, and the cap being placed on the reflector to cover the other one of said openings of the reflector, wherein the wavelength conversion member being held by the translucent member at its outer periphery,
   wherein a planar shape of the wavelength conversion member being substantially coincident with a cross-sectional beam pattern shape of emitted output light from the light-emitting element on an irradiated surface and is being evenly wavelength-converted.

2. The light-emitting device according to claim 1, wherein the planar shape of the wavelength conversion member is substantially coincident with a cross-sectional beam pattern shape of emitted output light from the light-emitting element on an irradiated surface.

3. The light-emitting device according to claim 1, wherein a the cross-sectional beam pattern shape of emitted output light from the light-emitting element on an irradiated surface is an ellipse and the planar shape of the wavelength conversion member includes a major axis of the ellipse.

4. The light-emitting device according to claim 1, further comprising a convergent lens placed inside the reflector to make light from the light-emitting element converge and the converging light incident on the wavelength conversion member.

5. The light-emitting device according to claim 1, further comprising a sealing member for sealing the light-emitting element inside the reflector.

6. The light-emitting device according to claim 1, wherein a thermal conductive member is provided such that it covers the wavelength conversion member at an opening part of the reflector.

7. The light-emitting device according to claim 1, wherein a dielectric film for reflecting light having a wavelength longer than a wavelength of light from the light-emitting element and the wavelength conversion member are arranged in the order mentioned from the light-emitting element side such that they cover an opening part of the reflector.

8. The light-emitting device according to claim 1, wherein the wavelength conversion member further includes a diffusion material for diffusing emitted light from the light-emitting element.

9. A light-emitting device comprising:
a support body;
a light-emitting element constituted by a laser diode mounted on the support body;
a cylindrical receptacle fixed to the support body in such a manner that an inner surface thereof surrounds the light-emitting element;
a cup section including a light reflection surface inclined from a light-transmitting aperture, which is produced by partially protruding an inner surface of the receptacle, toward a distal end of an opening part of the receptacle;
a cap including a wavelength conversion member in at least a part thereof, and provided such that it covers an opening part of the cup section; and
a convergent lens placed in a wide portion of the cylindrical receptacle at a position closer to the light-emitting element side than a narrower portion of the cup section and allowing light from the light-emitting element to converge and the converging light to pass through the aperture, thereby making the light incident on the wavelength conversion member.

10. The light-emitting device according to claim 9, wherein the cap is constituted by a lens-like wavelength conversion member.

11. The light-emitting device according to claim 9, wherein the wavelength conversion member is held by a translucent member at an outer circumference thereof.

12. A light-emitting device comprising:
a support body;
a light-emitting element constituted by a laser diode mounted on the support body;
a cylindrical receptacle fixed to the support body in such a manner that an inner surface thereof surrounds the light-emitting element;
a cup fixed to a distal end part of the receptacle at a proximal end part thereof and including a light reflection surface inclined from a light-transmitting aperture, which is produced by protruding a part of an inner surface thereof, toward a distal end of an opening part thereof;
a cap including a wavelength conversion member in at least a part thereof, the wavelength conversion member extending completely through the cap, and the cap being placed such that it covers an opening part of the cup; and
a convergent lens placed in the cylindrical receptacle at a position closer to the light-emitting element side than the cup section and allowing light from the light-emitting element to converge and the converging light to pass through the aperture, thereby irradiating the wavelength conversion member with the converging light.

13. The light-emitting device according to claim 12, wherein the wavelength conversion member is held by a translucent member at an outer circumference thereof.

14. A light-emitting device comprising:
a disk shaped support body;
a wavelength conversion member mounted on the support body; and
a light-emitting element constituted by a laser diode mounted obliquely downward to the wavelength conversion member and said support body, whereby light from the laser diode is made incident on the wavelength conversion member obliquely below the laser diode;
wherein said wavelength conversion member receives a peak intensity of irradiation by the light-emitting element and emits light different in wavelengths from light emitted by the light-emitting element when the light-emitting element emits the light.

* * * * *